United States Patent
Song et al.

(10) Patent No.: US 7,876,149 B2
(45) Date of Patent: Jan. 25, 2011

(54) HARMONIC QUADRATURE DEMODULATION APPARATUS AND METHOD THEREOF

(75) Inventors: Tai-Kyong Song, Seoul (KR); Sang-Min Kim, Seoul (KR); Jae-Hee Song, Seoul (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 267 days.

(21) Appl. No.: 12/289,877

(22) Filed: Nov. 6, 2008

(65) Prior Publication Data
US 2009/0121787 A1    May 14, 2009

(51) Int. Cl.
*H03D 3/00* (2006.01)
*H04L 27/22* (2006.01)

(52) U.S. Cl. .................. 329/304; 600/443; 600/458
(58) Field of Classification Search ............... 600/443, 600/458; 329/304; 359/278
See application file for complete search history.

(56) References Cited

U.S. PATENT DOCUMENTS 6,540,684 B2 *    4/2003   Averkiou et al. ............ 600/458

* cited by examiner

*Primary Examiner*—Arnold Kinkead
(74) *Attorney, Agent, or Firm*—The Nath Law Group; Jerald L. Meyer; Derek Richmond

(57) ABSTRACT

Disclosed herein is a harmonic quadrature demodulation apparatus and method. The harmonic quadrature demodulation apparatus includes an input terminal for externally receiving an input focused signal, a harmonic phase estimation unit for estimating a second-order harmonic phase component from the input focused signal. The second-order harmonic detection unit includes an in-phase component extractor, a quadrature component extratctor, a Hilbert transformer, an adder and a low pass filter. The in-phase component extractor extracts an in-phase component of the input focused signal. The quadrature component extractor extracts a quadrature component of the input focused signal.

7 Claims, 8 Drawing Sheets

HARMONIC QUADRATURE DEMODULATION APPARATUS AND METHOD THEREOF

CROSS-REFERENCE TO RELATED PATENT APPLICATION

This application claims the benefit of Korean Patent Application No. 10-2007-0113963, filed on Nov. 8, 2007, in the Korean Intellectual Property Office, the disclosure of which is incorporated herein in its entirety by reference.

BACKGROUND OF THE INVENTION

1. Field of the Invention

The present invention relates, in general, to a harmonic quadrature demodulation apparatus and method used for an ultrasound harmonic imaging scheme, and, more particularly, to a harmonic quadrature demodulation apparatus and method, which eliminate a fundamental frequency component from an externally received focused signal, and extracts only a second-order harmonic component from the focused signal.

2. Description of the Related Art

Harmonic imaging is a technique for extracting only harmonic components from a received signal and imaging the harmonic components. Since this harmonic imaging has better resolution than a method using a fundamental frequency, it is widely used to image a contrast agent or the characteristics of tissue. Harmonic imaging methods that are most frequently used may include a method using a band pass filter and a pulse inversion method.

Such a method using a band pass filter is a method of extracting harmonic components from an input focused signal using a band pass filter, and is problematic in that the bandwidth of a transmission signal is limited to prevent the spectrums of a fundamental frequency component and harmonic components from overlapping each other.

Further, a pulse inversion method is a method of performing two transmission/reception procedures using two transmission pulses having a phase difference of 180 degrees therebetween, thus eliminating a fundamental frequency component and retaining only harmonic components. In the case of this method, the bandwidth of a transmission signal is not limited, but there is a disadvantage in that, since transmission/reception must be performed twice, the frame rate is decreased to half that of the case where transmission/reception is performed once.

Accordingly, the present applicant intends to propose a scheme capable of overcoming the disadvantage of the pulse inversion method, and extracting harmonic components through only a single transmission/reception procedure without limiting the bandwidth of a transmission signal.

SUMMARY OF THE INVENTION

Accordingly, the present invention has been made keeping in mind the above problems occurring in the prior art, and an object of the present invention is to provide a harmonic quadrature demodulation apparatus and method, which eliminate a fundamental frequency component and extract the envelope of a second-order harmonic component from an input focused signal through suitable signal processing, thus extracting harmonic components through only a single transmission/reception procedure without limiting the bandwidth of a transmission signal.

In accordance with an aspect of the present invention to accomplish the above object, there is provided a harmonic quadrature demodulation apparatus, comprising an input terminal for externally receiving an input focused signal, a harmonic phase estimation unit for estimating a second-order harmonic phase component ($\phi_2$) of the input focused signal from the input focused signal, and a second-order harmonic detection unit for detecting a second-order harmonic component ($b(n)$) from the input focused signal using the second-order harmonic phase component, wherein the second-order harmonic detection unit comprises an in-phase component extractor connected to the input terminal and configured to extract an in-phase component of the input focused signal transmitted from the input terminal, a quadrature component extractor connected to the input terminal and configured to extract a quadrature component of the input focused signal transmitted from the input terminal, a Hilbert transformer connected to an output terminal of the quadrature component extractor and configured to Hilbert-transform a signal transmitted from the quadrature component extractor, an adder connected to an output terminal of the in-phase component extractor and an output terminal of the Hilbert transformer and configured to receive both an output signal of the in-phase component extractor and an output signal of the Hilbert transformer and to add the two received signals to each other, and a low pass filter connected to an output terminal of the adder and configured to receive a signal output from the adder and to filter the received signal, wherein the second-order harmonic detection unit outputs the second-order harmonic component of the input focused signal.

Preferably, the in-phase component extractor of the second-order harmonic detection unit may be implemented as a multiplier for multiplying two input signals, these being the input focused signal and a first modulated signal, the first modulated signal being $\cos(2\pi 2f_0 n + \phi_2)$.

Preferably, the quadrature component extractor of the second-order harmonic detection unit may be implemented as a multiplier for multiplying two input signals, these being the input focused signal and a second modulated signal, the second modulated signal being $\sin(2\pi 2f_0 n + \phi_2)$.

In accordance with another aspect of the present invention to accomplish the above object, there is provided a harmonic quadrature demodulation method, comprising (a) estimating a harmonic phase component ($\phi_2$) from an externally received input focused signal, and (b) detecting a second-order harmonic signal from the input focused signal using the harmonic phase component, wherein (b) comprises (b1) extracting an in-phase component signal of the input focused signal, (b2) extracting a quadrature component signal of the input focused signal, (b3) Hilbert-transforming the extracted quadrature component signal, and (b4) adding the in-phase component signal to the quadrature component signal that has been Hilbert-transformed, wherein the harmonic quadrature demodulation method is implemented to output the second-order harmonic component of the input focused signal.

Preferably, (b1) may be performed such that the in-phase component signal of the input focused signal is extracted by multiplying the input focused signal by a first modulated signal, the first modulated signal being $\cos(2\pi 2f_0 n + \phi_2)$.

Preferably, (b2) may be performed such that the quadrature component signal is extracted by multiplying the input focused signal by a second modulated signal, the second modulated signal being $\sin(2\pi 2f_0 n+\phi_2)$.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings.

Figure 1:
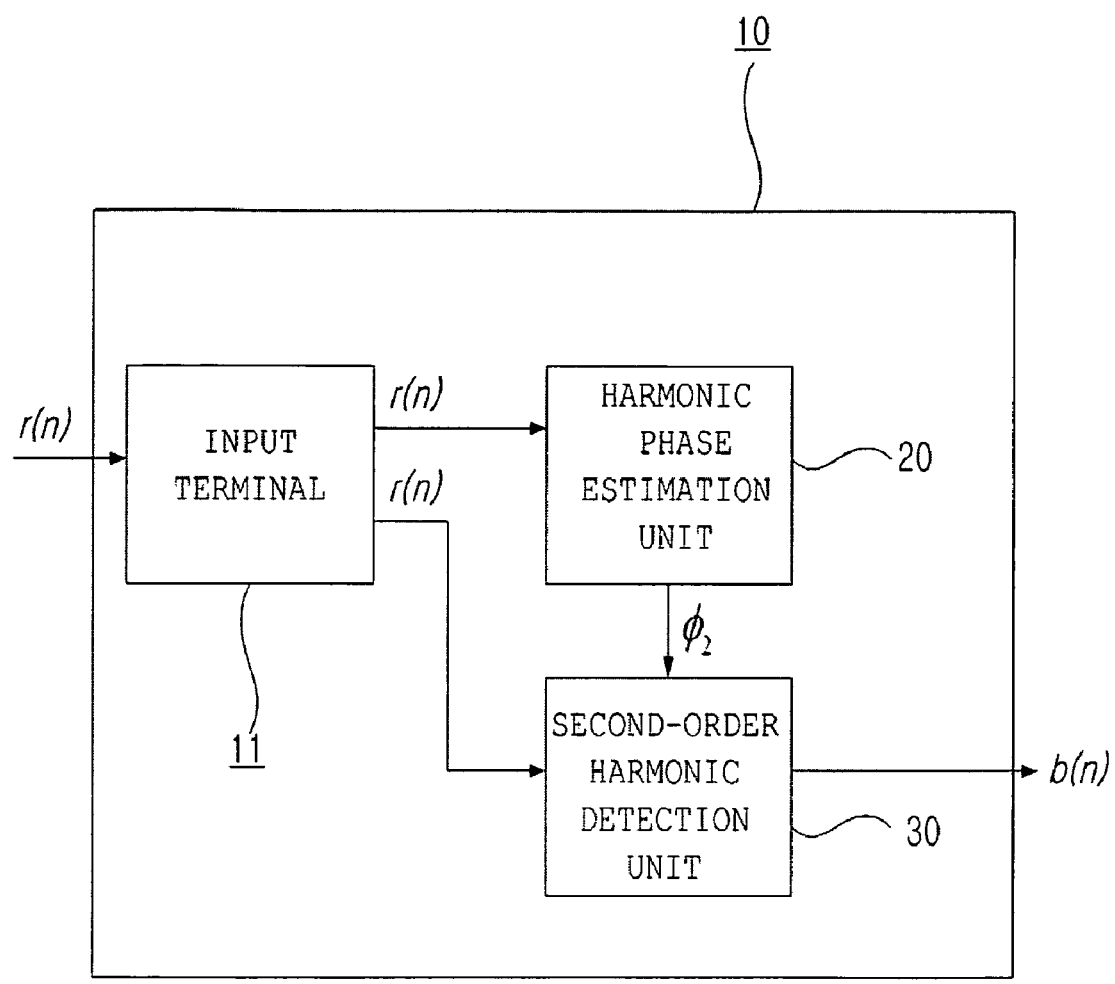
FIG. 1 is a block diagram schematically showing the construction of a harmonic quadrature demodulation apparatus according to an embodiment of the present invention.

FIG. 1 is a block diagram schematically showing the construction of a harmonic quadrature demodulation apparatus according to an embodiment of the present invention. Referring to FIG. 1, a harmonic quadrature demodulation apparatus 10 according to the present invention includes an input terminal 11 for receiving an input focused signal, a harmonic phase estimation unit 20, and a second-order harmonic detection unit 30.

The input terminal 11 externally receives an input focused signal r(n), and provides the input signal both to the harmonic phase estimation unit and to the second-order harmonic detection unit. The harmonic phase estimation unit 20 estimates the second-order harmonic phase component $\phi_2$ of the input focused signal from the input focused signal. The second-order harmonic detection unit 30 detects the second-order harmonic component b(n) from the input focused signal using the estimated second-order harmonic phase component.

Therefore, the harmonic quadrature demodulation apparatus according to the present invention can detect the second-order harmonic component b(n) regardless of the existence of an arbitrary phase component even if the input focused signal r(n) contains the arbitrary phase component.

Figure 2:
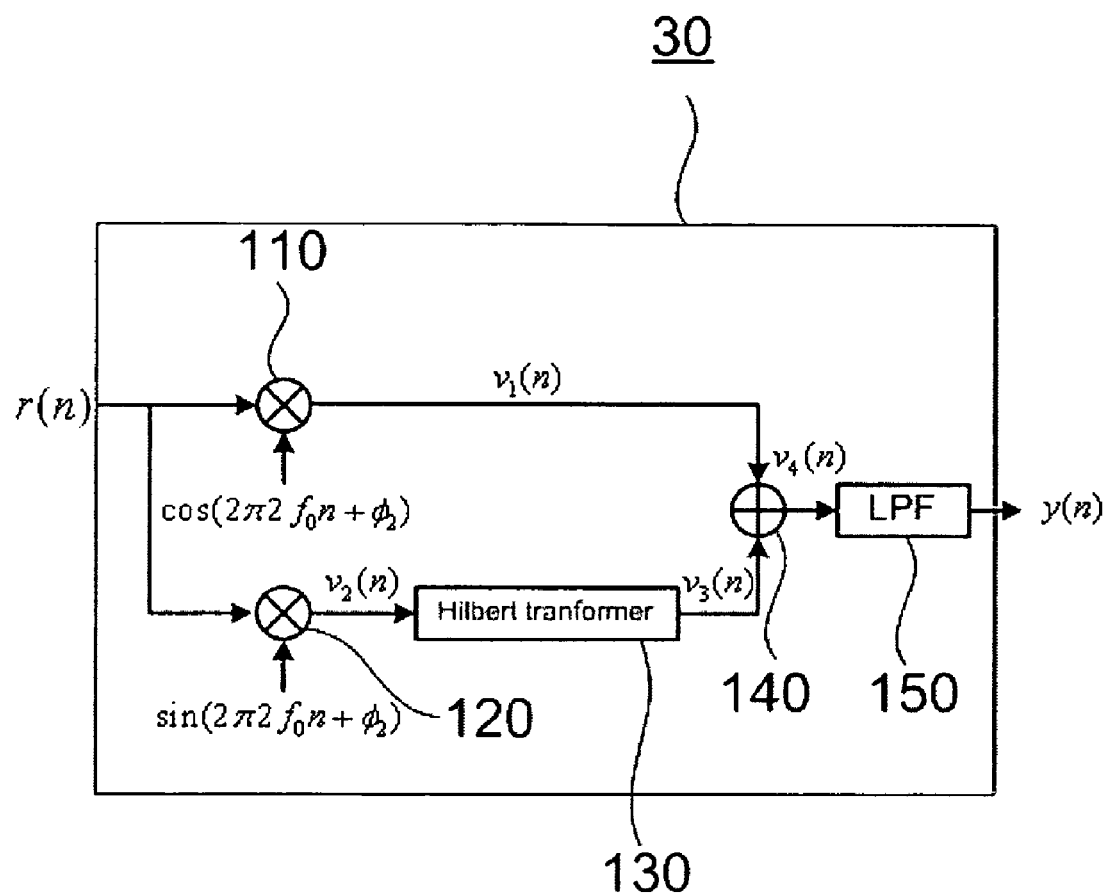
FIG. 2 is a block diagram schematically showing the construction of the second-order harmonic detection unit of a harmonic quadrature demodulation apparatus according to an embodiment of the present invention.

FIG. 2 is a block diagram showing the second-order harmonic detection unit 30 of the harmonic quadrature demodulation apparatus 10 according to the present invention. Hereinafter, the construction and operation of the second-order harmonic detection unit 30 will be described in detail with reference to FIG. 2. Referring to FIG. 2, the second-order harmonic detection unit 30 includes an in-phase component extractor 110, a quadrature component extractor 120, a Hilbert transformer 130, an adder 140, and a Low Pass Filter (LPF) 150.

First, the input terminal 11 externally receives the input focused signal r(n), and provides the input focused signal both to the in-phase component extractor 110 and to the quadrature component extractor 120. Hereinafter, a description will be made on the assumption that the input focused signal r(n) contains a fundamental frequency component, a second-order harmonic component, and an arbitrary phase component $\phi_2$, as given in the following Equation [1], $$r(n)=a(n)\cos(2\pi f_0 n+\phi_1)+b(n)\cos(2\pi 2f_0 n+\phi_2) \quad [1]$$

where a(n) is the envelope of the fundamental frequency component and b(n) is the envelope of the second-order harmonic component.

The in-phase component extractor 110 is a unit for extracting the in-phase component $v_1(n)$ of the input focused signal, transmitted from the input terminal, and is implemented as a multiplier for multiplying the input focused signal r(n) by the cosine signal $\cos(2\pi 2f_0 n+\phi_2)$ of a second-order harmonic frequency. The in-phase component $v_1(n)$ of the input focused signal r(n) represented by Equation [1] may be obtained, as shown in the following Equation [2].

$$\begin{aligned}v_1(n) &= r(n)\cdot\cos(2\pi 2f_0 n+\phi_2) \quad [2]\\ &= a(n)\cos(2\pi f_0 n+\phi_1)\cdot\cos(2\pi 2f_0 n+\phi_2)+\\ &\quad b(n)\cos(2\pi 2f_0 n+\phi_2)\cdot\cos(2\pi 2f_0 n+\phi_2)\\ &= \frac{1}{2}b(n)+\frac{1}{2}a(n)\cos(2\pi f_0 n+\phi_2-\phi_1)+\\ &\quad \frac{1}{2}a(n)\cos(2\pi 3f_0 n+\phi_2+\phi_1)+\frac{1}{2}b(n)\cos(2\pi 4f_0 n+2\phi_2)\end{aligned}$$

Meanwhile, the quadrature component extractor 120 is a unit for extracting the quadrature component $v_2(n)$ of the input focused signal transmitted from the input terminal, and is implemented as a multiplier for multiplying the input focused signal r(n) by a sine signal $\sin(2\pi 2f_0 n+\phi_2)$ at the second-order harmonic frequency. The quadrature component $v_2(n)$ of the input focused signal r(n) represented by Equation [1] may be obtained, as shown in the following Equation [3].

$$\begin{aligned}v_2(n) &= r(n)\cdot\sin(2\pi 2f_0 n+\phi_2) \quad [3]\\ &= a(n)\cos(2\pi f_0 n+\phi_1)\cdot\sin(2\pi 2f_0 n+\phi_2)+\\ &\quad b(n)\cos(2\pi 2f_0 n+\phi_2)\cdot\sin(2\pi 2f_0 n+\phi_2)\\ &= \frac{1}{2}a(n)\sin(2\pi f_0 n+\phi_2-\phi_1)+\\ &\quad \frac{1}{2}a(n)\sin(2\pi 3f_0 n+\phi_2+\phi_1)+\frac{1}{2}b(n)\sin(2\pi 4f_0 n+2\phi_2)\end{aligned}$$

Referring to Equations [2] and [3], the input focused signal r(n) is multiplied by the cosine signal $\cos(2\pi 2f_0 n+\phi_2)$ at the second-order harmonic frequency, so that b(n) is located around a DC component and $4f_0$, and a(n) is located around $f_0$ and $3f_0$. The input focused signal r(n) is multiplied by the sine signal $\sin(2\pi 2f_0 n+\phi_2)$ at the second-order harmonic frequency, so that b(n) is located around $4f_0$, and a(n) is located around $f_0$ and $3f_0$.

The Hilbert transformer 130 is connected to the output terminal of the quadrature component extractor and is configured to provide the Hilbert-transformed signal $v_3(n)$ of the signal $v_2(n)$ transmitted from the quadrature component extractor. The Hilbert-transformed signal $v_3(n)$ can be obtained using the following Equation [4].

$$v_3(n) = \text{hilbert}[v_2(n)] \quad [4]$$
$$= -\frac{1}{2}a(n)\cos(2\pi f_0 n + \phi_2 - \phi_1) -$$
$$\frac{1}{2}a(n)\cos(2\pi 3 f_0 n + \phi_2 + \phi_1) - \frac{1}{2}b(n)\cos(2\pi 4 f_0 n + 2\phi_2)$$

The adder 150 adds the output signal $v_1(n)$ of the in-phase component extractor and the output signal $v_3(n)$ of the Hilbert transformer, which are input thereto, to each other, and provides a resulting signal to the LPF 160. The signal $v_4(n)$ output from the adder 150 can be obtained by the following Equation [5].

$$v_4(n) = v_1(n) + v_3(n) = \frac{1}{2}b(n) \quad [5]$$

Meanwhile, the LPF 160 is connected to the output terminal of the adder and is configured to eliminate both noise and an undesired residual signal from the signal output from the adder.

Figure 3:
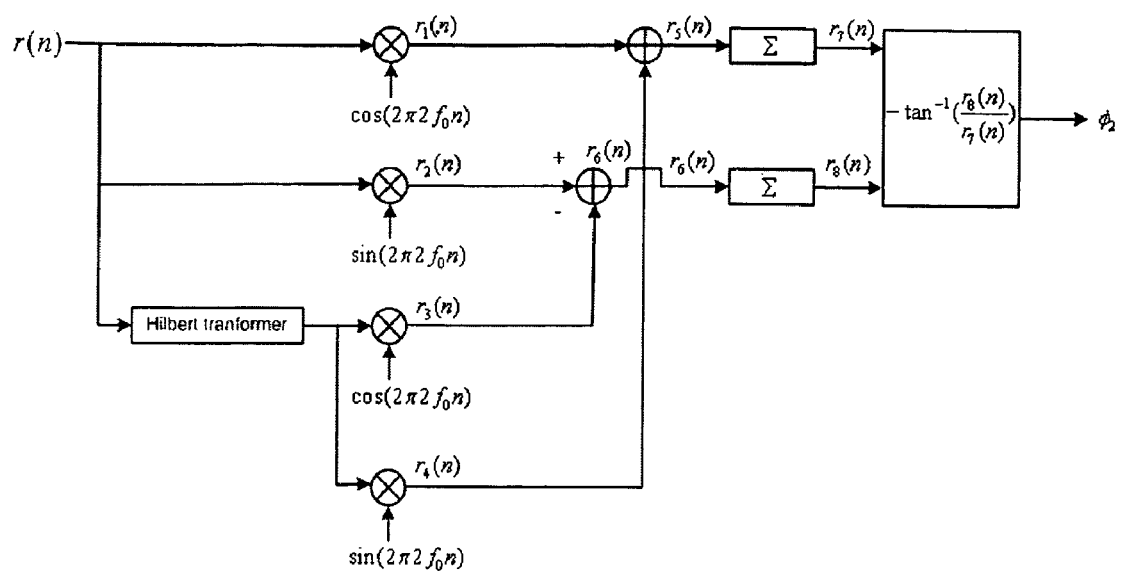
FIG. 3 is a block diagram schematically showing the construction of the harmonic phase estimation unit of a harmonic quadrature demodulation apparatus according to an embodiment of the present invention.

FIG. 3 is a block diagram showing the harmonic phase estimation unit 20 of the harmonic quadrature demodulation apparatus 10 according to the present invention. Hereinafter, with reference to FIG. 3, the construction and operation of the harmonic phase estimation unit 20 will be described below. Referring to FIG. 3, the harmonic phase estimation unit 20 sequentially obtains signals $r_1(n)$, $r_2(n)$, $r_3(n)$, $r_4(n)$, $r_5(n)$ $r_6(n)$, $r_7(n)$, and $r_8(n)$ from the input focused signal $r(n)$, ultimately estimates the second-order harmonic phase component $\phi_2$ of the input focused signal, and provides the estimated second-order harmonic phase component $\phi_2$ to the second-order harmonic detection unit 30.

The signal $r_1(n)$ modulated by multiplying the input focused signal by $\cos(2\pi 2 f_0 n)$ can be represented by the following Equation [6], and the signal $r_2(n)$ modulated by multiplying the input focus signal by $\sin(2\pi 2 f_0 n)$ can be represented by the following Equation [7].

$$r_1(n) = r(n) \cdot \cos(2\pi 2 f_0 n) \quad [6]$$
$$= a(n)\cos(2\pi f_0 n + \phi_1) \cdot \cos(2\pi 2 f_0 n) +$$
$$b(n)\cos(2\pi 2 f_0 n + \phi_2) \cdot \cos(2\pi 2 f_0 n)$$
$$= \frac{1}{2}b(n)\cos(\phi_2) + \frac{1}{2}a(n)\cos(2\pi 2 f_0 n - \phi_1) +$$
$$\frac{1}{2}a(n)\cos(2\pi 3 f_0 n + \phi_1) + \frac{1}{2}b(n)\cos(2\pi 4 f_0 n + \phi_2)$$

$$r_2(n) = r(n) \cdot \sin(2\pi 2 f_0 n) \quad [7]$$
$$= a(n)\cos(2\pi f_0 n + \phi_1) \cdot \sin(2\pi 2 f_0 n) +$$
$$b(n)\cos(2\pi 2 f_0 n + \phi_2) \cdot \sin(2\pi 2 f_0 n)$$
$$= -\frac{1}{2}b(n)\sin(\phi_2) + \frac{1}{2}a(n)\sin(2\pi 2 f_0 n - \phi_1) +$$
$$\frac{1}{2}a(n)\sin(2\pi 3 f_0 n + \phi_1) + \frac{1}{2}b(n)\sin(2\pi 4 f_0 n + \phi_2)$$

Next, the signal $r_3(n)$ modulated by Hilbert-transforming the input focused signal and multiplying the Hilbert-transformed input focused signal by $\cos(2\pi 2 f_0 n)$ can be represented by the following Equation [8], and the signal $r_4(n)$ modulated by multiplying the Hilbert-transformed input focused signal by $\sin(2\pi 2 f_0 n)$ can be represented by the following Equation [9].

$$r_3(n) = H[r(n)] \cdot \cos(2\pi 2 f_0 n) \quad [8]$$
$$= a(n)\sin(2\pi f_0 n + \phi_1) \cdot \cos(2\pi 2 f_0 n) +$$
$$b(n)\sin(2\pi 2 f_0 n + \phi_2) \cdot \cos(2\pi 2 f_0 n)$$
$$= \frac{1}{2}b(n)\sin(\phi_2) - \frac{1}{2}a(n)\sin(2\pi 2 f_0 n - \phi_1) +$$
$$\frac{1}{2}a(n)\sin(2\pi 3 f_0 n + \phi_1) + \frac{1}{2}b(n)\sin(2\pi 4 f_0 n + \phi_2)$$

$$r_4(n) = H[r(n)] \cdot \sin(2\pi 2 f_0 n) \quad [9]$$
$$= a(n)\sin(2\pi f_0 n + \phi_1) \cdot \sin(2\pi 2 f_0 n) +$$
$$b(n)\sin(2\pi 2 f_0 n + \phi_2) \cdot \sin(2\pi 2 f_0 n)$$
$$= \frac{1}{2}b(n)\cos(\phi_2) + \frac{1}{2}a(n)\cos(2\pi 2 f_0 n - \phi_1) -$$
$$\frac{1}{2}a(n)\cos(2\pi 3 f_0 n + \phi_1) - \frac{1}{2}b(n)\sin(2\pi 4 f_0 n + \phi_2)$$

Next, the signal $r_5(n)$ generated by adding $r_1(n)$ to $r_4(n)$ can be represented by the following Equation [10], and the signal $r_6(n)$ generated by adding $r_2(n)$ to $r_3(n)$ can be represented by the following Equation [11].

$$r_5(n) = r_1(n) + r_4(n) = b(n)\cos(\phi_2) + a(n)\cos(2\pi f_0 n - \phi_1) \quad [10]$$

$$r_6(n) = r_2(n) - r_3(n) = -b(n)\sin(\phi_2) + a(n)\sin(2\pi f_0 n - \phi_1) \quad [11]$$

Next, the signal $r_7(n)$ extracted from $r_5(n)$ can be represented by the following Equation [12], and the signal $r_8(n)$ extracted from $r_6(n)$ can be represented by the following Equation [13], $$r_7(n) = \sum_{n=-\infty}^{\infty} r_5(n) \quad [12]$$
$$= \sum_{n=-\infty}^{\infty} (b(n)\cos(\phi_2) + a(n)\cos(2\pi f_0 n - \phi_1))e^{-j\theta n}\bigg|_{\theta=0}$$
$$\approx \cos\phi_2 B(0)$$

$$r_8(n) = \sum_{n=-\infty}^{\infty} r_6(n) \quad [13]$$
$$= \sum_{n=-\infty}^{\infty} (-b(n)\sin(\phi_2) + a(n)\sin(2\pi f_0 n - \phi_1))e^{-j\theta n}\bigg|_{\theta=0}$$
$$\approx -\sin\phi_2 B(0)$$

where $B(0) = FT[b(n)]_{w=0}$.

The harmonic phase component $\phi_2$ can be calculated from $r_7(n)$ and $r_8(n)$, and can be represented by the following Equation [14].

$$-\tan^{-1}\left(\frac{r_8(n)}{r_7(n)}\right) = -\tan^{-1}\left(\frac{\sin\phi_2 B(0)}{\cos\phi_2 B(0)}\right) = -\tan^{-1}(\tan\phi_2) = \phi_2 \quad [14]$$

Therefore, through the harmonic quadrature demodulation apparatus of the present invention, the externally input focused signal undergoes a harmonic quadrature demodulation process of the present invention, and thereafter only b(n), which is the envelope of the second-order harmonic component, remains. Ultimately, the fundamental frequency component of the input focused signal is eliminated, and the second-order harmonic component of the input focused signal can be output. In particular, when the harmonic phase component $\phi_2$ is precisely estimated, the problem occurring due to variation in the phase of the second-order harmonic component can also be perfectly solved.

Hereinafter, respective procedures of the harmonic quadrature demodulation apparatus according to the present invention will be described on the basis of a frequency domain.

Figure 4:
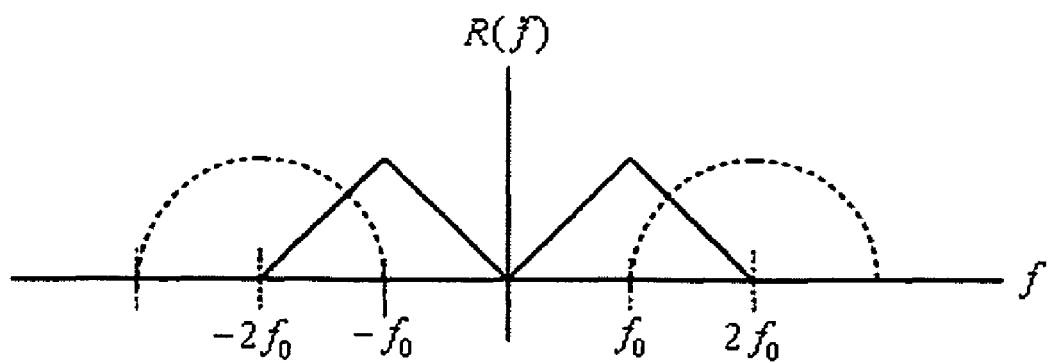
FIG. 4 is a graph showing the spectrum of the input focused signal r(n) of a harmonic quadrature demodulation apparatus according to an embodiment of the present invention.
Figure 5A:
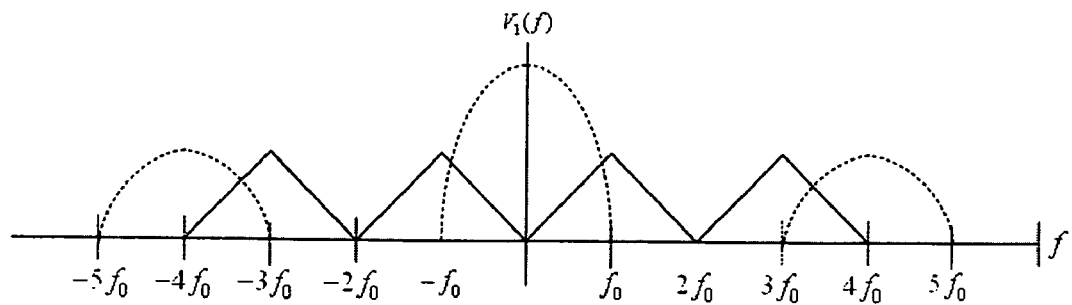
FIGS. 5A to 5C are graphs showing the spectrums of $v_1(n)$, $v_2(n)$ and $v_3(n)$, respectively.
Figure 5B:
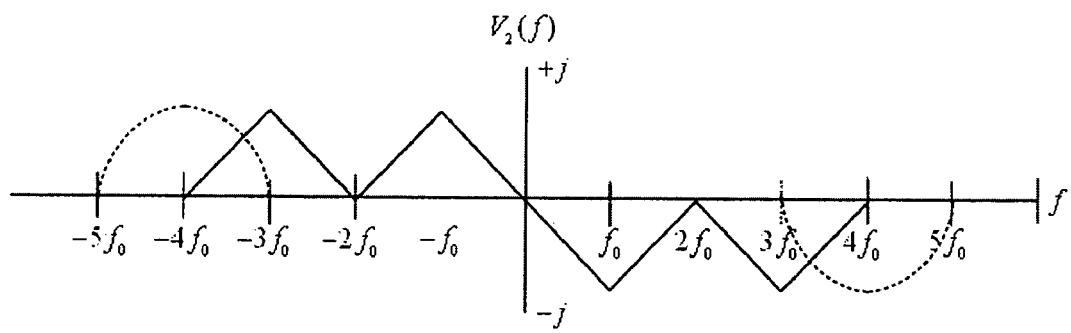
Figure 5C:
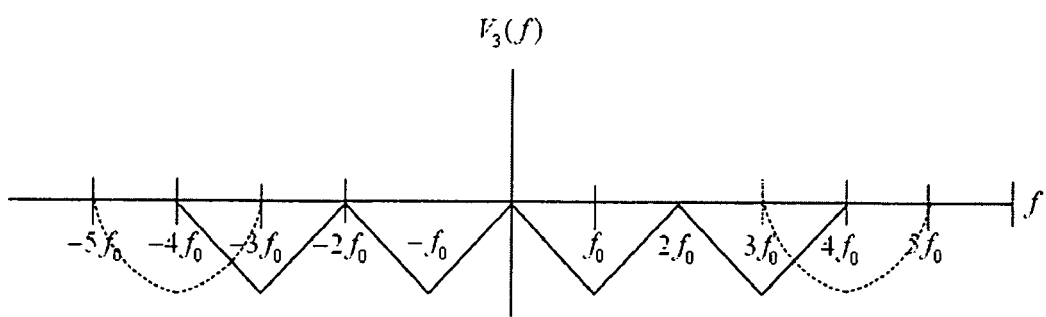

FIG. 4 is a graph showing the input focused signal r(n). The respective procedures are described on the assumption that a(n) and b(n) are a spectrum having a triangular shape and a spectrum having a semicircular shape, respectively, and the bandwidths thereof are $2f_0$. FIGS. 5A, 5B and 5C respectively illustrate the spectrums of $v_1(n)$, $v_2(n)$, and $v_3(n)$.

Since $v_1(n)$ is the product of r(n) and $\cos(2\pi 2f_0 n+\phi_2)$, it is represented by a convolution of respective Fourier transforms of r(n) and $\cos(2\pi 2f_0 n+\phi_2)$, and thus the spectrum of $v_1(n)$ is exhibited, as shown in FIG. 5A. Similarly, since $v_2(n)$ is the product of r(n) and $\sin(2\pi 2f_0 n+\phi_2)$, the spectrum of $v_2(n)$ is exhibited, as shown in FIG. 5B. When $v_2(n)$ is Hilbert-transformed, −j is multiplied by portions of the spectrum of $v_2(n)$ having positive frequencies and +j is multiplied by portions thereof having negative frequencies, and thus the spectrum of $v_3(n)$ is exhibited, as shown in FIG. 5C.

Figure 6:
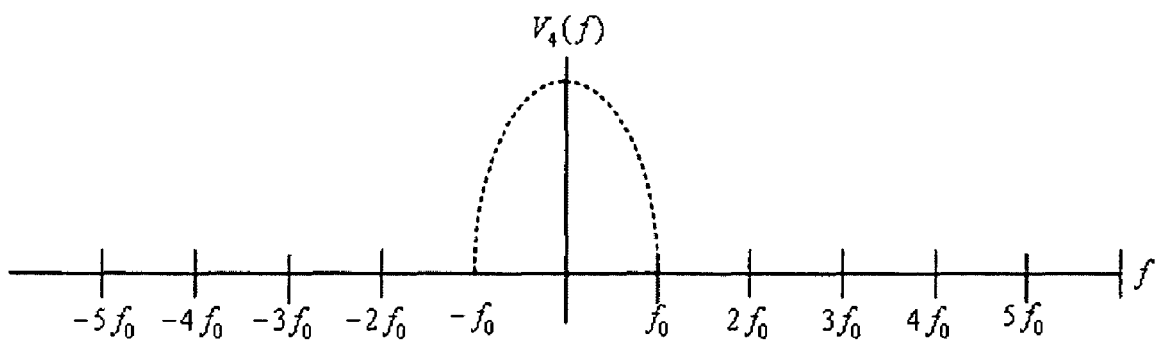
FIG. 6 is a graph showing the spectrum of an ultimate resulting value $v_4(n)$.

FIG. 6 is a graph showing the spectrum of an ultimate resulting value $v_4(n)$. Referring to FIG. 6, since $v_4(n)$ is generated by adding $v_1(n)$ to $v_3(n)$, the spectrum of FIG. 6 can be obtained by adding the spectrums of FIGS. 5A and 5C to each other. The results obtained by analyzing the method of the preset invention in a frequency domain show that only the spectrum of b(n) remains in a DC region. These results are coincident with those of the analysis of the method in a time domain.

According to the harmonic quadrature demodulation apparatus and method of the present invention, a fundamental frequency component can be eliminated from an input focused signal and a second-order harmonic component can be obtained therefrom through a single transmission/reception procedure. Further, according to the present invention, a second-order harmonic component can be obtained through only a single transmission/reception procedure without limiting the bandwidth of a transmission pulse.

Figure 7:
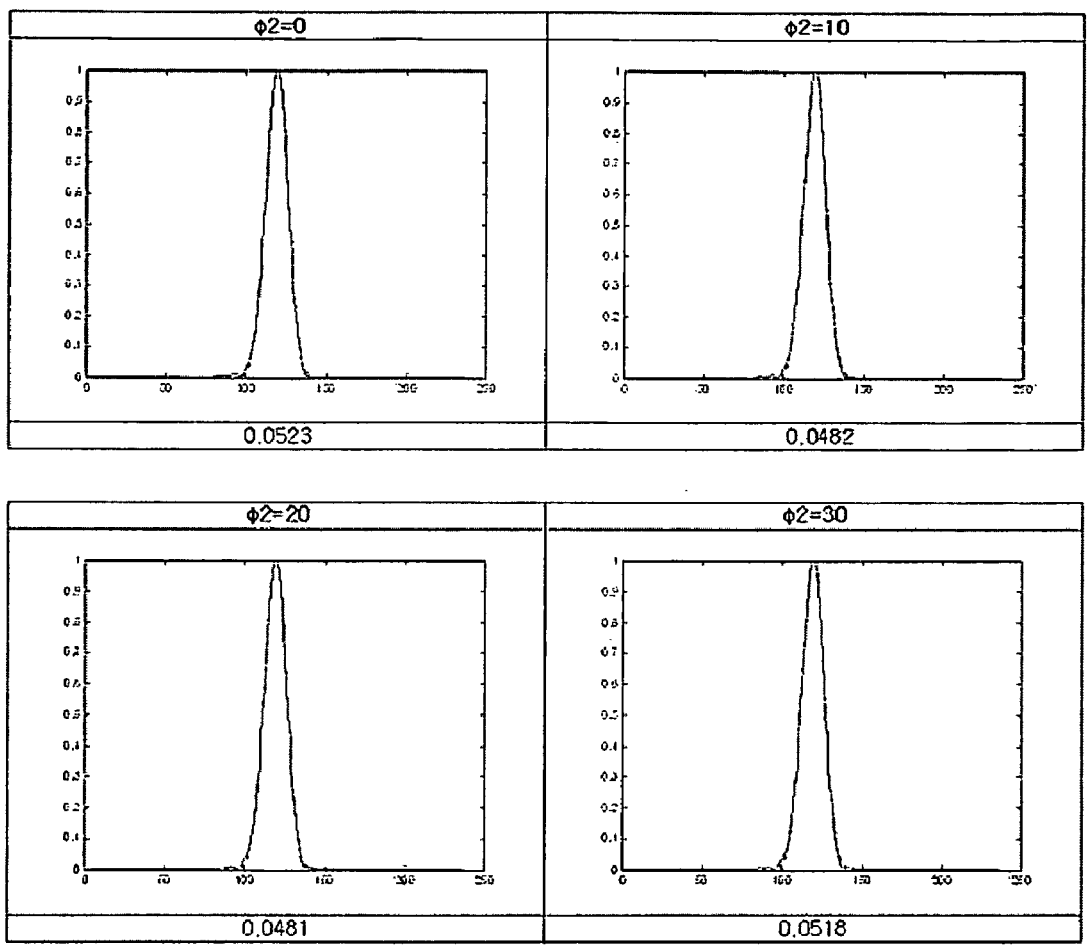
FIGS. 7 and 8 are graphs showing the results of a simulation performed using MATLAB to monitor the operation of a harmonic quadrature demodulation apparatus according to the present invention.
Figure 8:
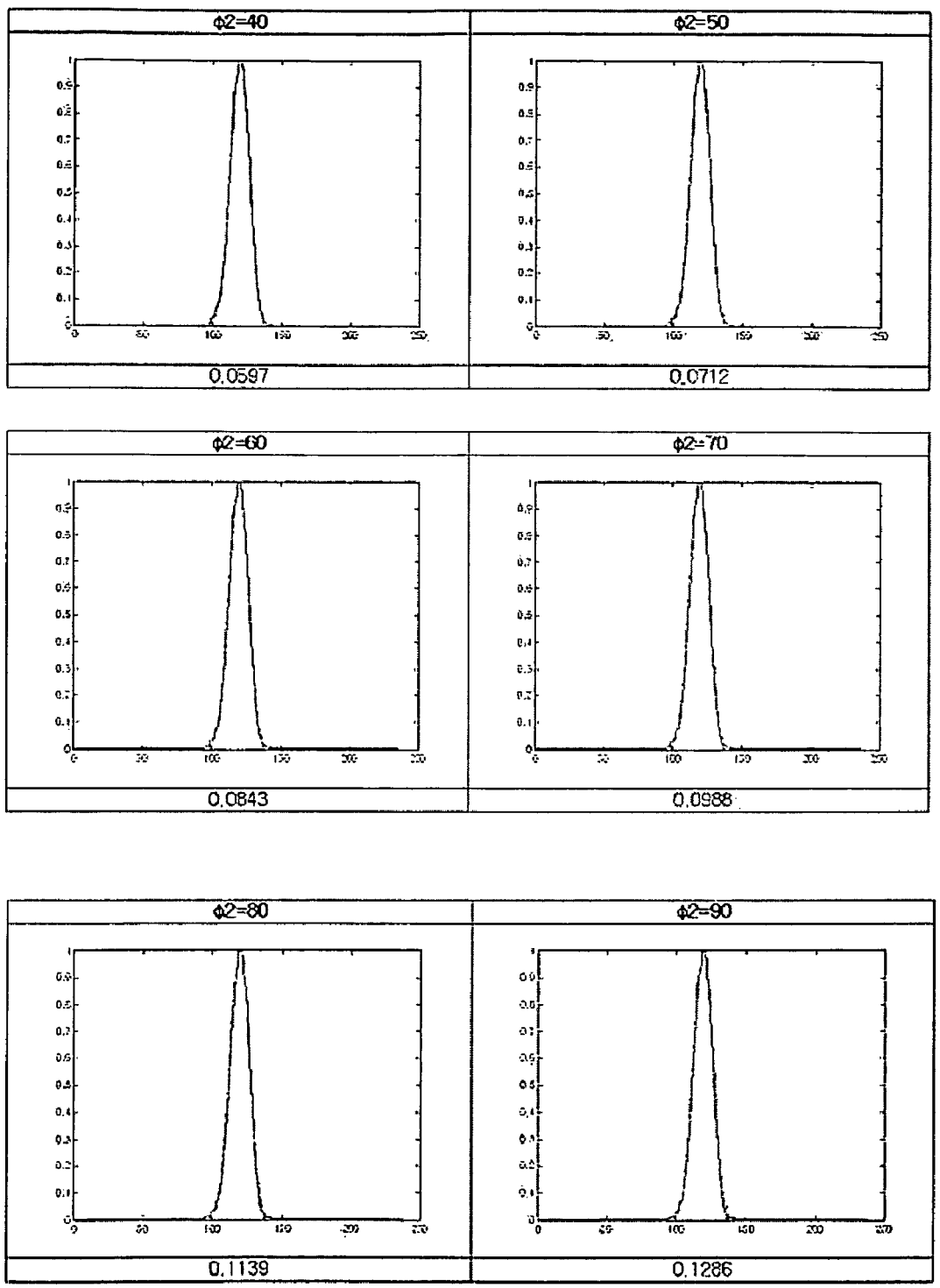

FIGS. 7 and 8 are graphs showing the results of simulations conducted using MATLAB to monitor the operation of the harmonic quadrature demodulation apparatus according to the present invention. In detail, FIGS. 7 and 8 are graphs showing a second-order harmonic signal detected by the apparatus of the present invention and a second-order harmonic signal detected by a conventional pulse inversion technique while a second-order harmonic phase component contained in an input focused signal is sequentially changed from 0 to 90 degrees in steps of 10 degrees. In the simulations, a center frequency was set to 3 MHz, a sampling frequency was set to 40 MHz, and an input signal r(n) was modeled using a sinusoidal signal, a window function, and a high pass filter. In FIGS. 7 and 8, the results of the present invention are indicated by red solid lines, and the results of the conventional pulse inversion technique are indicated by blue dotted lines. Numerals indicated below respective graphs denote energy differences between the above two methods.

Through FIGS. 7 and 8, the energy difference between the envelopes of second-order harmonic components obtained by the method of the present invention and the conventional pulse inversion method is about 0.1%. It can be seen that the apparatus of the present invention has almost the same performance as the conventional pulse inversion technique even in the situation in which the phase of a second-order harmonic component is changed.

According to the present invention, a second-order harmonic component can be obtained through simple signal processing without requiring a modification of a transmission/reception circuit, so that performance, such as a frame rate or a motion error, can be remarkably improved without limiting a bandwidth when the present invention is applied to a human body.

Therefore, the present invention can obtain a second-order harmonic component through a single transmission/reception procedure in the situation in which a fundamental frequency component overlaps the second-order harmonic component in a frequency domain, thus realizing a frame rate twice as high as that of the pulse inversion method which requires two transmission/reception procedures, and reducing motion defects.

Furthermore, according to the method of the present invention, the image quality of a tissue imaging method or an ultrasound imaging method using a contrast agent can be improved, and the apparatus and method of the present invention can be very efficiently used, especially for, harmonic images of a reflector that is moving fast.

As described above, a harmonic quadrature demodulation apparatus and method according to the present invention can extract the harmonic components of an input focused signal, and can be widely used for an ultrasound imaging method using contrast agent, or medical fields for imaging the characteristics of tissue.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A harmonic quadrature demodulation apparatus, comprising:
    an input terminal for externally receiving an input focused signal;
    a harmonic phase estimation unit for estimating a second-order harmonic phase component ($\phi_2$) of the input focused signal from the input focused signal; and
    a second-order harmonic detection unit for detecting a second-order harmonic component (b(n)) from the input focused signal using the second-order harmonic phase component,
    wherein the second-order harmonic detection unit comprises:
    an in-phase component extractor connected to the input terminal and configured to extract an in-phase component of the input focused signal transmitted from the input terminal,
    a quadrature component extractor connected to the input terminal and configured to extract a quadrature component of the input focused signal transmitted from the input terminal,
    a Hilbert transformer connected to an output terminal of the quadrature component extractor and configured to Hilbert-transform a signal transmitted from the quadrature component extractor, and
    an adder connected to an output terminal of the in-phase component extractor and an output terminal of the Hilbert transformer and configured to receive both an output signal of the in-phase component extractor and an output signal of the Hilbert transformer and to add the two received signals to each other, wherein the second-order harmonic detection unit outputs the second-order harmonic component of the input focused signal.

2. The harmonic quadrature demodulation apparatus according to claim 1, wherein the in-phase component extractor of the second-order harmonic detection unit is implemented as a multiplier for multiplying two input signals, these being the input focused signal and a modulated signal, the modulated signal being $\cos(2\pi 2f_0 n + \phi_2)$.

3. The harmonic quadrature demodulation apparatus according to claim 1, where the second-order harmonic detection unit further comprises a low pass filter connected to an output terminal of the adder and configured to receive a signal output from the adder and to filter the received signal.

4. The harmonic quadrature demodulation apparatus according to claim 1, wherein the quadrature component extractor of the second-order harmonic detection unit is implemented as a multiplier for multiplying two input signals, these being the input focused signal and a modulated signal, the modulated signal being $\sin(2\pi 2f_0 n + \phi_2)$.

5. A harmonic quadrature demodulation method, comprising:

(a) estimating a harmonic phase component ($\phi_2$) from an externally received input focused signal; and (b) detecting a second-order harmonic signal from the input focused signal using the harmonic phase component, wherein (b) comprises:

(b1) extracting an in-phase component signal of the input focused signal, (b2) extracting a quadrature component signal of the input focused signal, (b3) Hilbert-transforming the extracted quadrature component signal, and (b4) adding the in-phase component signal to the quadrature component signal that has been Hilbert-transformed, wherein the harmonic quadrature demodulation method is implemented to output the second-order harmonic component of the input focused signal.

6. The harmonic quadrature demodulation method according to claim 5, wherein (b1) is performed such that the in-phase component signal of the input focused signal is extracted by multiplying the input focused signal by a modulated signal, the modulated signal being $\cos(2\pi 2f_0 n + \phi_2)$.

7. The harmonic quadrature demodulation method according to claim 5, wherein (b2) is performed such that the quadrature component signal is extracted by multiplying the input focused signal by a modulated signal, the modulated signal being $\sin(2\pi 2f_0 n + \phi_2)$.

* * * * *